(12) United States Patent
Yu et al.

(10) Patent No.: US 12,732,132 B2
(45) Date of Patent: Sep. 8, 2026

(54) CURVED PHOTOVOLTAIC MEMBER AND PHOTOVOLTAIC BUILDING SURFACE

(71) Applicant: SHENZHEN HELLO TECH ENERGY CO., LTD, Shenzhen (CN)

(72) Inventors: Huajun Yu, Shenzhen (CN); Zhongwei Sun, Shenzhen (CN); Yanjun Zhu, Shenzhen (CN); Rao Fu, Shenzhen (CN); Dengfeng Fan, Shenzhen (CN); Jie Zhang, Shenzhen (CN)

(73) Assignee: SHENZHEN HELLO TECH ENERGY CO., LTD, Shenzhen (CN)

( * ) Notice: Subject to any disclaimer, the term of this patent is extended or adjusted under 35 U.S.C. 154(b) by 0 days.

(21) Appl. No.: 18/830,616

(22) Filed: Sep. 11, 2024

(65) Prior Publication Data

US 2025/0158561 A1 May 15, 2025

Related U.S. Application Data

(63) Continuation of application No. PCT/CN2024/095485, filed on May 27, 2024.

(30) Foreign Application Priority Data

Nov. 14, 2023 (CN) ........................ 202323081639.0

(51) Int. Cl.
*H02S 20/26* (2014.01)
*H10F 19/80* (2025.01)
*H10F 77/12* (2025.01)

(52) U.S. Cl.
CPC .......... *H02S 20/26* (2014.12); *H10F 19/807* (2025.01); *H10F 77/126* (2025.01)

(58) Field of Classification Search
CPC ........ H02S 20/26; H10F 19/807; H10F 19/85; H10F 19/902; H10F 19/908;
(Continued)

(56) References Cited

U.S. PATENT DOCUMENTS

| | | | |
|---|---|---|---|
| 8,003,882 | B2 | 8/2011 | Pisklak et al. |
| 2010/0263718 | A1 | 10/2010 | Abiko |

(Continued)

FOREIGN PATENT DOCUMENTS

| | | | |
|---|---|---|---|
| CN | 108599684 | A | 9/2018 |
| CN | 110289330 | A | 9/2019 |

(Continued)

OTHER PUBLICATIONS

The Grant Notice from corresponding Chinese Application No. 202323081639.0, dated Jun. 28, 2024. English translation attached.

(Continued)

*Primary Examiner* — Mayla Gonzalez Ramos

(57) ABSTRACT

A curved photovoltaic member includes a power generation layer, a current transmission layer, a front plate, and a back plate. The current transmission layer is located at a second side of the power generation layer and is electrically connected to the power generation layer. The front plate is located at a first side of the power generation layer. The back plate is located at a side of the current transmission layer away from the power generation layer.

14 Claims, 6 Drawing Sheets

(58) Field of Classification Search
CPC .... H10F 10/146; H10F 77/219; H10F 77/937; H10F 77/939
See application file for complete search history.

(56) References Cited

U.S. PATENT DOCUMENTS

| | | | | |
|---|---|---|---|---|
| 2012/0167954 | A1* | 7/2012 | Meakin | H10F 19/902 136/249 |
| 2015/0303342 | A1 | 10/2015 | Bultman et al. | |
| 2018/0198011 | A1* | 7/2018 | Jeon | H10F 19/80 |
| 2018/0316302 | A1 | 11/2018 | Okawa et al. | |
| 2019/0148576 | A1 | 5/2019 | Netter | |
| 2019/0245478 | A1* | 8/2019 | de Vries | H10F 19/85 |
| 2023/0420588 | A1* | 12/2023 | Thakkar | H10F 19/85 |

FOREIGN PATENT DOCUMENTS

| | | | |
|---|---|---|---|
| CN | 210272388 | U | 4/2020 |
| CN | 210985989 | U | 7/2020 |
| CN | 212257416 | U | 12/2020 |
| CN | 212392252 | U | 1/2021 |
| CN | 219107350 | U | 5/2023 |
| EP | 3553944 | A1 | 10/2019 |
| JP | 2014532293 | A | 12/2014 |
| JP | 2015159286 | A | 9/2015 |
| JP | 2015536571 | A | 12/2015 |
| WO | 2009060753 | A1 | 5/2009 |
| WO | 2019196332 | A1 | 10/2019 |

OTHER PUBLICATIONS

International Search Report dated Aug. 19, 2024 in International Application No. PCT/CN2024/095485. English translation attached.
Extended European Search Report dated Oct. 14, 2025 received in corresponding European Application No. EP24798380.2.
Notice of Reasons for Refusal dated Dec. 16, 2025 received in corresponding patent family application No. JP2024563477. English translation attached.
First Office Action dated May 29, 2026 received in corresponding patent family application No. EP24798380.2.

* cited by examiner

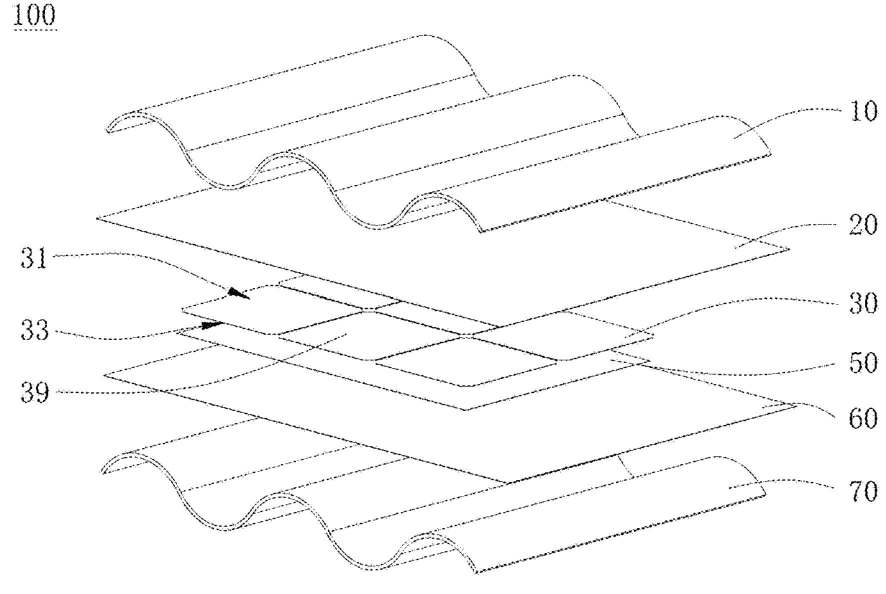
FIG. 1
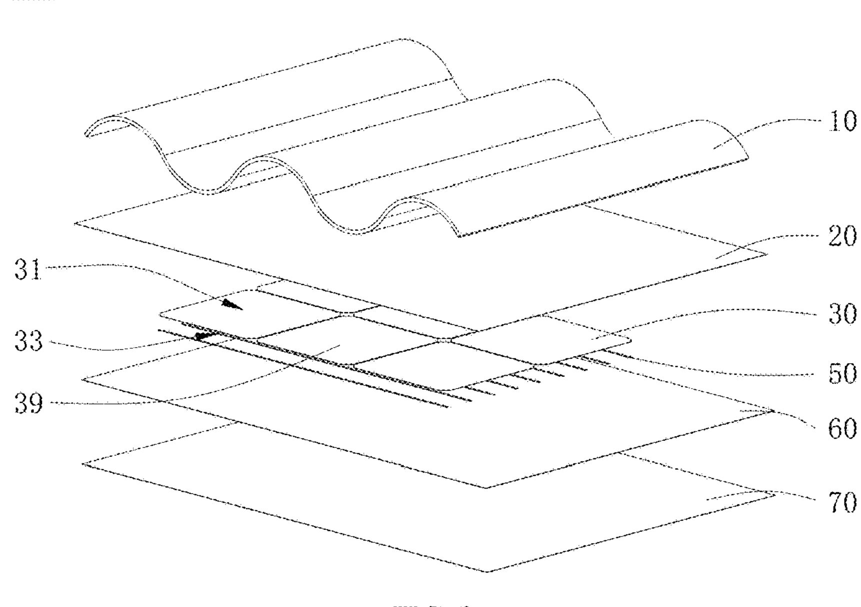
FIG. 2
100
10
30
50
70
FIG. 3

100

30

CURVED PHOTOVOLTAIC MEMBER AND PHOTOVOLTAIC BUILDING SURFACE

CROSS-REFERENCE TO RELATED APPLICATION

This application is a continuation of International Application No. PCT/CN2024/095485, filed on May 27, 2024, which claims priority to Chinese patent application No. 202323081639.0, filed with China National Intellectual Property Administration on Nov. 14, 2023, which is incorporated herein by reference.

FIELD

The present disclosure relates to the technical field of photovoltaic technologies, and more particularly, to a curved photovoltaic member and a photovoltaic building surface.

BACKGROUND

In order to be matched and mounted with traditional tiles on building, curved photovoltaic tiles have emerged. The original curved photovoltaic tile is developed based on a flexible copper-indium-gallium-selenide solar cell Although the copper-indium-gallium-selenide solar cell has remarkable flexibility characteristics, the copper-indium-gallium-selenide solar cell only has power generation efficiency ranging from 12% to 14% and a high cost. In order to improve the power generation efficiency and reduce the cost, most of the current curved photovoltaic tiles use crystalline-silicon solar cells, and the used crystalline-silicon solar cell has a high photoelectric conversion efficiency. However, due to high brittleness of the crystalline-silicon solar cell, the crystalline-silicon solar cell is easy to fracture when subjected to a bending stress, resulting in a small ratio of arc length to a corresponding chord length of the curve segment of the current curved photovoltaic tile, thereby leading to a poor fit between the curved photovoltaic tile and the building.

SUMMARY

An implementation of the present disclosure provides a curved photovoltaic member and a photovoltaic building surface, which are at least configured to solve problems that the curved photovoltaic member has a small curve curvature and a poor fit with the building.

The curved photovoltaic member according to the implementations of the present disclosure includes a power generation layer, a current transmission layer, a front plate, and a back plate. The power generation layer includes a first side and a second side opposite to the first side. The current transmission layer is located at the second side of the power generation layer and is electrically connected to the power generation layer. The front plate is located at the first side of the power generation layer. The back plate is located at a side of the current transmission layer away from the power generation layer. The front plate, the power generation layer, the current transmission layer, and the back plate are sequentially laminated.

In some implementations, the front plate is a rigid light-transmitting plate in a shape with a curved surface, and the back plate is a rigid plate in a shape with the same curved surface as the front plate.

In some implementations, the front plate is a rigid light-transmitting plate in the shape with the curved surface, and the back plate is a planar flexible film that is configured to bend into a shape with the same curved surface as the front plate.

In some implementations, the power generation layer is a planar silicon-based structure, and the current transmission layer is a metal conductive structure. Each of the power generation layer and the metal conductive structure is configured to bend into a shape with the same curved surface as the front plate.

In some implementations, the curved photovoltaic member has a bending radius ranging from 25 mm to 200 mm.

In some implementations, a longitudinal projection of the curved surface is a curve constituted by one curve segment; a longitudinal projection of the curved surface is a curve constituted by a plurality of curve segments connected in sequence; or a longitudinal projection of the curved surface is a special-shaped curve constituted by a plurality of curve segments and a straight segment.

In some implementations, when the longitudinal projection of the curved surface is the curve constituted by the plurality of curve segments connected in sequence, two adjacent curve segments of the plurality of curve segments have opposite bending directions, and the plurality of curve segments has a same bending radius. When the longitudinal projection of the curved surface is the special-shaped curve constituted by the plurality of curve segments and the straight segment, the plurality of curve segments has a same bending direction and a same bending radius.

In some implementations, the power generation layer includes a photoelectric conversion layer and an electrode layer disposed at a side of the photoelectric conversion layer away from the front plate. The photoelectric conversion layer is configured to convert light energy into electric energy, and the electrode layer is electrically connected to the current transmission layer.

In some implementations, the electrode layer includes a plurality of positive electrodes and a plurality of negative electrodes. Each of the plurality of positive electrodes is in a dot shape. Each of the plurality of negative electrodes is in a dot shape. The current transmission layer is in a sheet-like shape, and the plurality of negative electrodes and the plurality of positive electrodes are connected in series and/or in parallel through the current transmission layer.

In some implementations, the power generation layer includes a plurality of power generation sub-layers arranged in an array. Each of the plurality of power generation sub-layers includes a plurality of positive electrodes arranged in an array and a plurality of negative electrodes arranged in an array. The array of the plurality of positive electrodes are staggered with the array of the plurality of negative electrodes in rows; and the current transmission layer includes a first sub-portion, a second sub-portion, and a third sub-portion that are sequentially staggered from each other in a first direction and arranged at intervals. The first sub-portion is configured to electrically connect positive electrodes or negative electrodes in the power generation sub-layer and configured to electrically connect positive electrodes and negative electrodes of two adjacent power generation sub-layers of the plurality of power generation sub-layers in a second direction. The second sub-portion is configured to electrically connect positive electrodes and negative electrodes of two adjacent power generation sub-layers of the plurality of power generation sub-layers in the first direction. The third sub-portion is configured to electrically connect negative electrodes or positive electrodes in the power generation sub-layer, and the first direction is perpendicular to the second direction.

In some implementations, the electrode layer includes a plurality of positive electrodes and a plurality of negative electrodes. Each of the plurality of positive electrodes is in a linear shape. Each of the plurality of negative electrodes is in a linear shape. The current transmission layer is in a linear shape, and the plurality of negative electrodes and the plurality of positive electrodes are connected in series and/or in parallel through the current transmission layer.

In some implementations, the power generation layer includes a plurality of power generation sub-layers arranged in an array. Each of the plurality of power generation sub-layers includes a plurality of positive electrodes and a plurality of negative electrodes arranged in a second direction. The plurality of positive electrodes and the plurality of negative electrodes are alternatively arranged with each other; and the current transmission layer includes a plurality of first conductive wires, a plurality of second conductive wires, and a plurality of third conductive wires that are arranged sequentially at intervals in a first direction. The plurality of first conductive wires is configured to electrically connect positive electrodes or negative electrodes in the power generation sub-layer. The plurality of second conductive wires is configured to electrically connect positive electrodes and negative electrodes of two adjacent power generation sub-layers of the plurality of power generation sub-layers in the first direction. The plurality of third conductive wires is configured to electrically connect positive electrodes or negative electrodes in the power generation sub-layer and configured to electrically connect positive electrodes and negative electrodes of two adjacent power generation sub-layers of the plurality of power generation sub-layers in a second direction of the current transmission layer, and the first direction is perpendicular to the second direction.

In some implementations, the curved photovoltaic member further includes a first adhesive layer and a second adhesive layer. The first adhesive layer is configured to connect the front plate and the power generation layer, and the second adhesive layer is configured to connect the current transmission layer and the back plate.

A photovoltaic building surface according to the implementations of the present disclosure includes the curved photovoltaic member according to any one of the implementations as described above. Adjacent curved photovoltaic members are connected to each other.

In the curved photovoltaic member and the photovoltaic building surface according to the implementations of the present disclosure, the current transmission layer is provided only at the second side of the power generation layer, and the current transmission layer is not provided at the first side of the power generation layer. In this way, a contact area between the first side of the power generation layer and light is larger, a light utilization rate of the power generation layer is higher, and a power generation efficiency of the curved photovoltaic member is higher. Moreover, since the current transmission layer is only provided at the second side of the power generation layer, the power generation layer may be entirely bent with a large curvature, and the curved photovoltaic member has a large bending curvature. Compared with the current curved photovoltaic member, the curved photovoltaic member according to the implementations of the present disclosure has a large curve curvature and provides a better fit with the building.

Additional aspects and advantages of the present disclosure will be given in part in the following description, or become apparent in part from the following description, or can be learned from practicing of the present disclosure.

BRIEF DESCRIPTION OF THE DRAWINGS

The above and/or additional aspects and advantages of the present disclosure will become more apparent and more understandable from the following description of implementations taken in conjunction with the accompanying drawings, in which:

FIG. 1 is a schematic perspective exploded view showing a curved photovoltaic member according to an implementation of the present disclosure.

FIG. 2 is a schematic perspective exploded view showing a curved photovoltaic member according to another implementation of the present disclosure.

FIG. 3 is a schematic perspective assembly view showing a curved photovoltaic member according to an implementation of the present disclosure.

DETAILED DESCRIPTION

Figure 4:
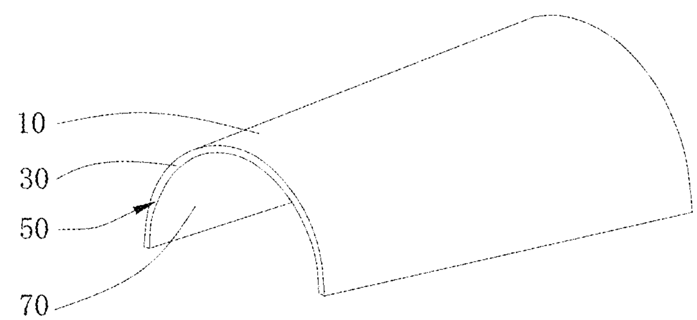
FIG. 4 is a schematic perspective assembly view showing a curved photovoltaic member according to another implementation of the present disclosure.

In order to clarify the above-mentioned objects, features, and advantages of the present disclosure, specific implementations of the present disclosure are described in detail below in conjunction with the accompanying drawings. In the following description, many specific details are provided to facilitate full understanding of the present disclosure. However, the present disclosure can be implemented in various manners other than those described herein, and similar improvements can be made by those skilled in the art without contradicting the intent of the present disclosure. Therefore, the present disclosure is not limited by specific implementations disclosed below.

In the description of the present disclosure, it needs to be understood that, orientation or position relationship indicated by terms such as “longitudinal”, “lateral”, “length”, “width”, “thickness”, “over”, “below”, “front”, “back”, “left”, “right”, “vertical”, “horizontal”, “top”, “bottom”, "in", "out", "clockwise", "anti-clockwise", "axial", "radial" and "circumferential" is based on the orientation or position relationship shown in the accompanying drawings, and is merely for the convenience of describing the present disclosure and simplifying the description, rather than indicating or implying that the associated device or element must have a specific orientation, or be constructed and operated in a specific orientation, and therefore cannot be understood as a limitation on the present disclosure.

In addition, the terms "first" and "second" are only used for descriptive purposes, and cannot be understood as indicating or implying relative importance or implicitly indicating the number of indicated technical features. Therefore, the features associated with "first" and "second" may explicitly or implicitly include at least one of the features. In the description of the present disclosure, "plurality of" means at least two, such as two, three, etc., unless otherwise specifically defined.

In the present disclosure, unless otherwise clearly specified and limited, terms such as "install", "connect", "connect to", "fix" and the like should be understood in a broad sense. For example, it may be a fixed connection or a detachable connection or connection as one piece; mechanical connection or electrical connection; direct connection or indirect connection through an intermediate; internal communication of two components or the interaction relationship between two components. For those skilled in the art, the specific meaning of the above-mentioned terms in the present disclosure can be understood according to specific circumstances.

In the present disclosure, unless expressly stipulated and defined otherwise, the first feature "on" or "under" the second feature may mean that the first feature is in direct contact with the second feature, or the first and second features are in indirect contact through an intermediate. Moreover, the first feature "above" the second feature may mean that the first feature is directly above or obliquely above the second feature, or simply mean that the level of the first feature is higher than that of the second feature. The first feature "below" the second feature may mean that the first feature is directly below or obliquely below the second feature, or simply mean that the level of the first feature is smaller than that of the second feature.

It should be noted that when an element is referred to as being "fixed to" or "disposed at" another element, it can be directly at the other element or a centered element may also occur. When an element is considered to be "connected to" another element, it may be directly connected to the other element or a centered element may occur simultaneously. As used herein, the terms "vertical", "horizontal", "over", "below", "left", "right", and similar expressions are for illustrative purposes only and are not meant to be the only implementations.

Figure 13:
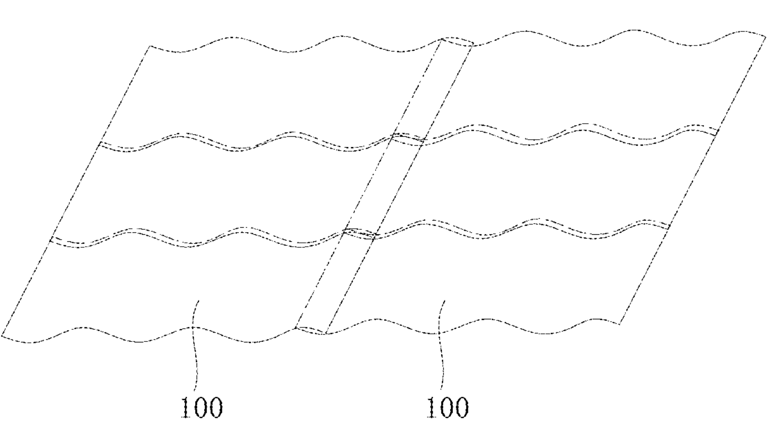
FIG. 13 is a schematic structural view showing a photovoltaic building surface according to some implementations of the present disclosure.

In order to be matched and mounted with traditional tiles on building, curved photovoltaic tiles have emerged. The original curved photovoltaic tile is developed based on a flexible copper-indium-gallium-selenide solar cell. Although the copper-indium-gallium-selenide solar cell has remarkable flexibility characteristics, the copper-indium-gallium-selenide solar cell only has power generation efficiency ranging from 12% to 14% and a high cost. In order to improve the power generation efficiency and reduce the cost, most of the current curved photovoltaic tiles use crystalline-silicon solar cells, and the used crystalline-silicon solar cell has a high photoelectric conversion efficiency. However, due to high brittleness of the crystalline-silicon solar cell, the crystalline-silicon solar cell is easy to fracture when subjected to a bending stress, resulting in a small ratio of arc length to a corresponding chord length of the curve segment of the current curved photovoltaic tile, thereby leading to a poor fit between the curved photovoltaic tile and the building. In order to solve this problem, the implementations of the present disclosure provide a curved photovoltaic member 100 (as shown in FIG. 1) and a photovoltaic building surface 1000 (as shown in FIG. 13).

Referring to FIG. 1 and FIG. 2, a curved photovoltaic member 100 according to the implementations of the present disclosure includes a power generation layer 30, a current transmission layer 50, a front plate 10, and a back plate 70. The power generation layer 30 includes a first side 31 and a second side 33 opposite to the first side 31. The current transmission layer 50 is located at the second side 33 of the power generation layer 30 and is electrically connected to the power generation layer 30. The front plate 10 is located at the first side 31 of the power generation layer 30. The back plate 70 is located at a side of the current transmission layer 50 away from the power generation layer 30. The front plate 10, the power generation layer 30, the current transmission layer 50, and the back plate 70 are sequentially laminated.

Specifically, the curved photovoltaic member 100 is a structure that is configured to convert light energy into electric energy to supply power for other elements and may be used as a component of the building. The curved photovoltaic member 100 may be mounted at a top or a side surface of the building. The curved photovoltaic member 100 may also make aesthetics of the building good while generating electricity.

The front plate 10 is a structure for protecting the first side 31 of the power generation layer 30. The back plate 70 is a structure for protecting the second side 33 of the power generation layer 30 and the current transmission layer 50. Preferably, each of the front plate 10 and the back plate 70 has a certain mechanical strength. Moreover, the front plate 10 and the back plate 70 also have waterproof and insulating properties. In this way, the front plate 10 and the back plate 70 can better protect the power generation layer 30 and the current transmission layer 50.

The power generation layer 30 is a structure for receiving light energy and converting the light energy into electric energy. The current transmission layer 50 is used for transmitting the electric energy generated in the power generation layer 30 into other circuits, to enable the curved photovoltaic member 100 to charge other elements. The current transmission layer 50 may be connected to the second side 33 of the power generation layer 30 by welding or conductive adhesive bonding. The current transmission layer 50 is made of a metal material that includes, but is not limited to, silver, copper, and the like. The current transmission layer 50 may be a conductive adhesive, a conductive adhesive tape, or the like.

In the curved photovoltaic member 100 according to the implementations of the present disclosure, the current transmission layer 50 is provided only at the second side 33 of the power generation layer 30, and the current transmission layer 50 is not provided at the first side 31 of the power generation layer 30. In this way, a contact area between the first side 31 of the power generation layer 30 and light is larger, a light utilization rate of the power generation layer 30 is higher, and a power generation efficiency of the curved photovoltaic member 100 is higher. Moreover, since the current transmission layer 50 is only provided at the second side 33 of the power generation layer 30, the power generation layer 30 may be entirely bent with a large curvature, and the curved photovoltaic member 100 has a large bending curvature. Compared with the current curved photovoltaic member, the curved photovoltaic member 100 according to the implementations of the present disclosure has a large curve curvature and provides a better fit with the building.

The curved photovoltaic member 100 is further described below with reference to the accompanying drawings.

Referring to FIG. 1, in some embodiments, the front plate 10 is a rigid light-transmitting plate in a shape with a curved surface, and the back plate 70 is a rigid plate in a shape with the same curved surface as the front plate 10. The front plate 10 may be, but is not limited to transparent rigid glass or the like. Preferably, light transmittance of the front plate 10 is high. For example, the light transmittance may be greater than or equal to 70%, so that most or even all of the light may pass through the front plate 10 to reach the power generation layer 30, enabling the power generation layer 30 to convert the received light energy into electric energy. For example, the light transmittance of the front plate 10 may be 70%, 73.1%, 75.6%, 77%, 78.5%, 80.3%, 83%, 85.1%, 87.2%, 90.5%, 92.4%, 93.7%, 95.6%, 97.8%, or 100%. At this time, the back plate 70 may be rigid glass having the same light transmittance as the front plate 10 or rigid glass having different light transmittance from the front plate 10. For example, the back plate 70 may be rigid glass having light transmittance smaller than 70% or lighttight rigid glass.

Referring to FIG. 2, in another implementation, the front plate 10 is the rigid light-transmitting plate in the shape with the curved surface, and the back plate 70 is a planar flexible film that is configured to bend into a shape with the same curved surface as the front plate 10. At this time, a material of the back plate 70 may be polyethylene terephthalate (PET) or a composite material of PET. When the back plate 70 needs to be fitted with the front plate 10, the power generation layer 30, and the current transmission layer 50, the flexible back plate 70 is bent into a shape with the same curved surface as the front plate 10.

Referring to FIG. 1 to FIG. 3, in some implementations, the power generation layer 30 is a planar silicon-based structure, and the current transmission layer 50 is a metal conductive structure. Each of the power generation layer 30 and the current transmission layer 50 is bent into a shape with the same curved surface as the front plate 10. A material of the current transmission layer 50 may be, but is not limited to, gold, silver, copper, or the like. Each of the power generation layer 30 and the current transmission layer 50 has a certain bending ability. When each of the power generation layer 30 and the current transmission layer 50 needs to be fitted with the front plate 10, each of the power generation layer 30 and the current transmission layer 50 is bent into a shape with the same curved surface as the front plate 10. In this way, the front plate 10, the power generation layer 30, the current transmission layer 50, and the back plate 70 can be sequentially and closely fitted with each other.

Figure 5:
FIG. 5 is a schematic perspective assembly view showing a curved photovoltaic member according to yet another implementation of the present disclosure.
Figure 5:
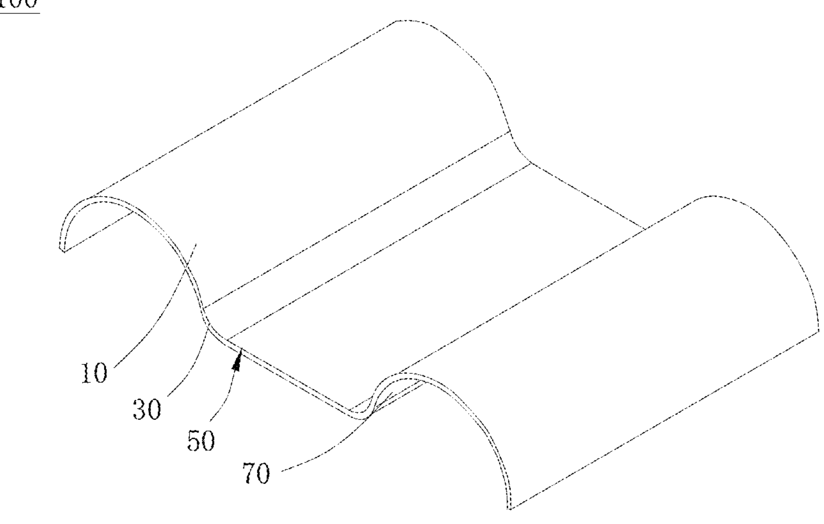

Referring to FIG. 3 to FIG. 5, as described above, each of the front plate 10, the power generation layer 30, the current transmission layer 50, and the back plate 70 is in the shape with the same curved surface. In some implementations, a longitudinal projection of the curved surface is a curve constituted by one curve segment. As shown in FIG. 4. at this time, the curved photovoltaic member 100 has a small volume and a light weight, and is convenient to carry. In other some implementations, the longitudinal projection of the curved surface is a curve constituted by a plurality of curve segments connected in sequence. As shown in FIG. 3, at this time, the curve constituted by the plurality of curve segments is in a wavy shape. Moreover, a volume of the curved photovoltaic member 100 is large. Assembly and construction of the curved photovoltaic member 100 on the building are convenient. In other some implementations, the longitudinal projection of the curved surface is a special-shaped curve constituted by a plurality of curve segments and a straight segment. As shown in FIG. 5, the special-shaped curve is constituted by sequentially connecting the curve segments and the straight segment. The curved photovoltaic member 100 is beautiful as a whole. Moreover, mounting between the plurality of curved photovoltaic members 100 is stable.

Referring to FIG. 1 to FIG. 3, in some implementations, the curved photovoltaic member 100 has a bending radius ranging from 25 mm to 200 mm. The bending radius of the curved photovoltaic member 100 refers to a bending radius of each curve segment (each curve segment in the curved photovoltaic member 100 has the same bending radius). In the curved photovoltaic member 100, each of the front plate 10, the power generation layer 30, the current transmission layer 50, and the back plate 70 has the same bending radius.

Specifically, the bending radius of the curved photovoltaic member 100 may be 25 mm, 38.6 mm, 43.7 mm, 50 mm, 63.4 mm, 70.8 mm, 81.3 mm, 98.7 mm, 101 mm, 109.2 mm, 112.5 mm, 120.9 mm, 136.7 mm, 162.1 mm, 200 mm, or the like. When the bending radius of the curved photovoltaic member 100 is smaller than 25 mm, a risk of fracture of the curved photovoltaic member 100 easily occurs. When the bending radius of the curved photovoltaic member 100 is greater than 200 mm, the curved photovoltaic member 100 has a less obvious bending curvature and a less enough aesthetics, and provides a poor fit with the building. When the curved photovoltaic member 100 has the bending radius ranging from 25 mm to 200 mm, the curved photovoltaic member 100 has an obvious bending curvature and good aesthetics, and provides a better fit with the building. Meanwhile, the power generation layer 30 is not easy to fracture.

Referring to FIG. 3, in some implementations, when the longitudinal projection of the curved surface is the curve constituted by the plurality of curve segments connected in sequence, two adjacent curve segments of the plurality of curve segments have opposite bending directions, and the plurality of curve segments have a same bending radius. For example, when a first curve segment of the curved photovoltaic member 100 is in a similarly parabolic shape with a downward opening (a middle part of the curve segment is convex upwards), a second curve segment adjacent to the first curve segment is in a similarly parabolic shape with an upward opening (a middle part of the curve segment is concave downwards), a third curve segment adjacent to the second curve segment is in a similarly parabolic shape with a downward opening (a middle part of the curve segment is convex upwards), a fourth curve segment adjacent to the third curve segment is in a similarly parabolic shape with an upward opening (a middle part of the curve segment is concave downwards), and the rest can be done in the same manner. Therefore, the curve constituted by the plurality of curve segments is in a wavy shape. Moreover, the curve segments have a same bending radius. For example, a bending radius of the first curve segment is 70.8 mm, and a bending radius of each of the second curve segment, the third curve segment, and the rest of curve segments is also 70.8 mm. Alternatively, the bending radius of the first curve segment is 120 mm, and the bending radius of each of the second curve segment, the third curve segment, and the rest of curve segments is also 120 mm.

Referring to FIG. 5, in other some implementations, when the longitudinal projection of the curved surface is the special-shaped curve constituted by the plurality of curve segments and the straight segment, the plurality of curve segments has a same bending direction and a same bending radius. For example, each of the plurality of curve segments is in a similarly parabolic shape with a downward opening (a middle part of the curve segment is convex upwards), and two adjacent curve segments are connected to each other by the straight segment. The bending radii of the plurality of curve segments may be, but are not limited to, 63.4 mm, 70.8 mm, 76.8 mm, 81.3 mm, 83.5 mm, or 91.6 mm, etc.

Figure 6:
FIG. 6 is a schematic structural view showing a power generation layer of a curved photovoltaic member according to an implementation of the present disclosure.

Referring to FIG. 1 and FIG. 6, in some implementations, the power generation layer 30 includes a photoelectric conversion layer 35 and an electrode layer 37 disposed at a side of the photoelectric conversion layer 35 facing away from the front plate 10. The photoelectric conversion layer 35 is configured to convert light energy into electric energy, and the electrode layer 37 is electrically connected to the current transmission layer 50.

Specifically, the photoelectric conversion layer 35 of the present disclosure is crystalline silicon and is configured to receive the light energy and convert the light energy into the electric energy. The electric energy generated by the photoelectric conversion layer 35 is transmitted to the current transmission layer 50 through the electrode layer 37 and is transmitted to other circuits by the current transmission layer 50.

Figure 7:
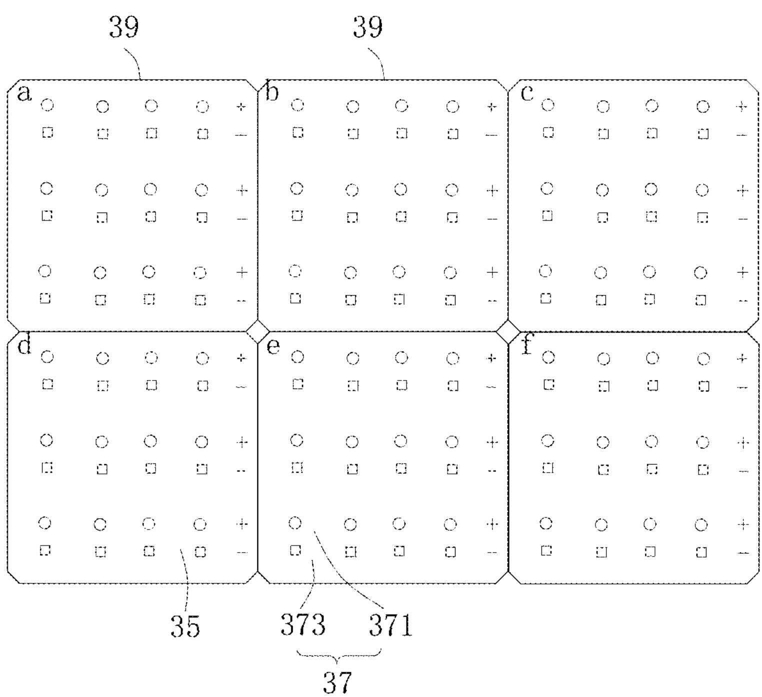
FIG. 7 is a schematic plan view showing a power generation layer of a curved photovoltaic member according to an implementation of the present disclosure.
Figure 10:
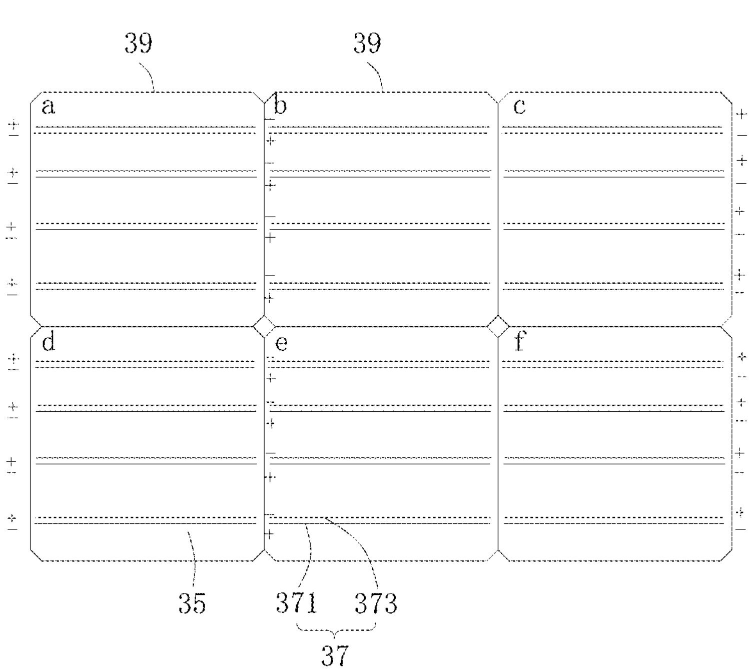
FIG. 10 is a schematic plan view showing a power generation layer of a curved photovoltaic member according to another implementation of the present disclosure.

Referring to FIG. 7 and FIG. 10, the electrode layer 37 includes a positive electrode 371 and a negative electrode 373, and the current transmission layer 50 is connected to the positive electrode 371 and the negative electrode 373 of the electrode layer 37. Since each of the positive electrode 371 and the negative electrode 373 is provided at the side of the photoelectric conversion layer 35 facing away from the front plate 10, such that the current transmission layer 50 only needs to be provided at the second side 33 of the power generation layer 30. When the current transmission layer 50 is provided at the second side 33 of the power generation layer 30, a side of the power generation layer 30 close to the front plate 10 has no shielding of the current transmission layer 50. In this way, a photoelectric conversion efficiency of the photoelectric conversion layer 35 can be enhanced, and the power generation layer 30 as a whole is more beautiful.

Each of the positive electrode 371 and the negative electrode 373 of the present disclosure is made of the metal material. The metal material may be, but is not limited to, gold, silver, copper, or the like. A thickness of each of the positive electrode 371 and the negative electrode 373 disposed at the side of the photoelectric conversion layer 35 facing away from the front plate 10 may be, but is not limited to, 23 μm, 30 μm, 54 μm, 70 μm, 82 μm, or the like. Preferably, the thickness of the positive electrode 371 and the thickness of the negative electrode 373 are same, enabling the current transmission layer 50 to be well fitted with each of the positive electrode 371 and the negative electrode 373. An electrical connection manner between the positive electrode 371 and the current transmission layer 50 may be, but is not limited to, welding, ohmic contact, or the like. An electrical connection manner between the negative electrode 373 and the current transmission layer 50 may be, but is not limited to, welding, ohmic contact, or the like.

The positive electrode and the negative electrode of the power generation layer used in the current curved photovoltaic member are disposed at the first side and the second side of the power generation layer, respectively. The current transmission layer of the current curved photovoltaic member needs to cross the first side and the second side of the power generation layer. When the power generation layer is bent, the current transmission layer tends to pull the power generation layer, resulting in a small bending curvature of the power generation layer and even fracture of the power generation layer. Referring to FIG. 1 and FIG. 2, in the curved photovoltaic member 100 according to the implementations of the present disclosure, the current transmission layer 50 is provided only at the second side 33 of the power generation layer 30. When the power generation layer 30 is bent, the current transmission layer 50 does not pull the power generation layer 30. In this way, a curvature at which the power generation layer 30 is bent is large. Moreover, a curvature at which the curved photovoltaic member 100 is bent is large, and a risk of the fracture of the power generation layer 30 may be reduced.

Figure 8:
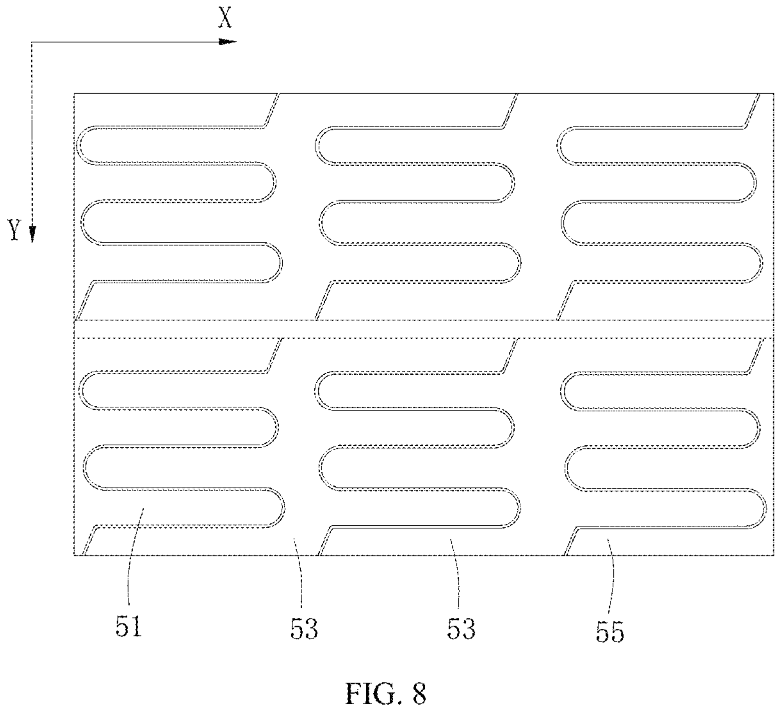
FIG. 8 is a schematic plan view showing a current transmission layer of a curved photovoltaic member according to an implementation of the present disclosure.

Referring to FIG. 1, FIG. 7, and FIG. 8, in some implementations, the electrode layer 37 includes a plurality of positive electrodes 371 and a plurality of negative electrodes 373. Each of the plurality of positive electrodes 371 are in a dot shape. Each of the plurality of negative electrodes 373 are in a dot shape. The current transmission layer 50 is in a sheet-like shape. The plurality of negative electrodes 373 and the plurality of positive electrodes 371 are connected in series and/or in parallel through the current transmission layer 50. In the implementation, the plurality of positive electrodes 371 and the plurality of negative electrodes 373 of the electrode layer 37 are connected in series through the current transmission layer 50.

Referring to FIG. 7, specifically, the power generation layer 30 includes a plurality of power generation sub-layers 39 arranged in an array. Each of the plurality of power generation sub-layers 39 includes a plurality of positive electrodes 371 arranged in an array and a plurality of negative electrodes 373 arranged in an array. The array of the plurality of positive electrodes 371 are staggered with the array of the plurality of negative electrodes 373 in rows. A quantity of power generation sub-layers 39 may be two, three, four, six, or more. When there are three power generation sub-layers 39, the three power generation sub-layers 39 are sequentially connected to form an arrangement form of three rows and one column. When there are four power generation sub-layers 39, the four power generation sub-layers 39 may be sequentially connected to form an arrangement form of four rows and one column or arranged to form an arrangement form of two rows and two columns (in a "matts" shape). When there are six power generation sub-layers 39, the six power generation sub-layers 39 may be sequentially connected to form an arrangement form of six rows and one column or arranged to form an arrangement form of two rows and three columns. When there are six power generation sub-layers 39 in the present disclosure, the six power generation sub-layers 39 are arranged to form an arrangement form of two rows and three columns.

In the present disclosure, the plurality of positive electrodes 371 on each power generation sub-layer 39 are arranged to form an arrangement form of three rows and four columns, and the plurality of negative electrodes 373 on each power generation sub-layer 39 are also arranged to form the arrangement form of three rows and four columns. Moreover, an arrangement form of staggering in rows is formed between the positive electrodes 371 and the negative electrodes 373.

Figure 9:
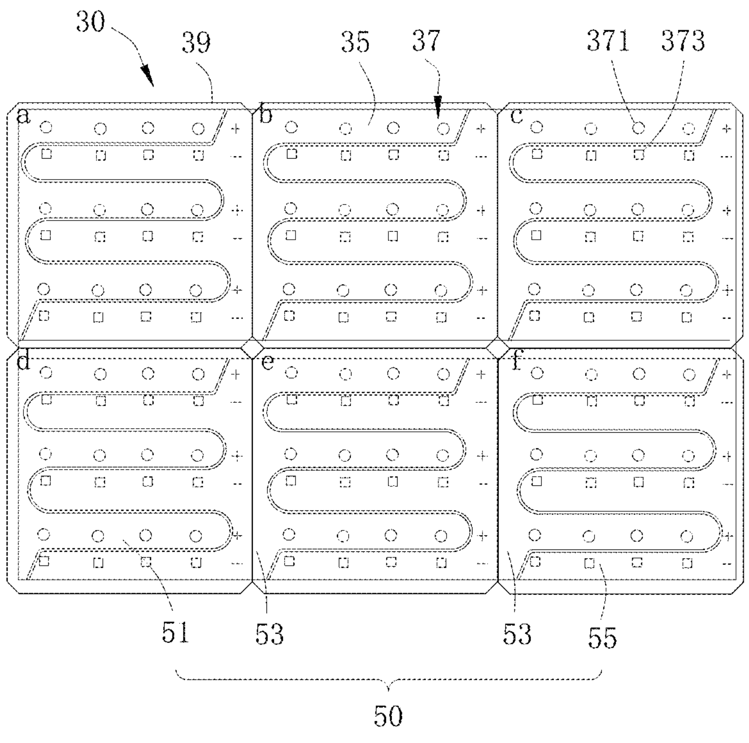
FIG. 9 is a schematic view showing an engagement of the power generation layer shown in FIG. 7 and the current transmission layer shown in FIG. 8.

Referring to FIG. 8 and FIG. 9, in a case where each of the positive electrode 371 and the negative electrode 373 is in the dot shape, the current transmission layer 50 is in the sheet-like shape and includes a first sub-portion 51, a second sub-portion 53, and a third sub-portion 55. The first sub-portion 51, the second sub-portion 53, and the third sub-portion 55 are sequentially staggered from each other in a first direction X and arranged at intervals. The first sub-portion 51 is configured to electrically connect positive electrodes 371 or negative electrodes 373 in the power generation sub-layer 39 and electrically connect positive electrodes 371 and negative electrodes 373 of two adjacent power generation sub-layers 39 of the plurality of power generation sub-layers 39 in a second direction Y. The second sub-portion 53 is configured to electrically connect positive electrodes 371 and negative electrodes 373 of two adjacent power generation sub-layers 39 of the plurality of power generation sub-layers 39 in the first direction X. The third sub-portion 55 is configured to electrically connect negative electrodes 373 or positive electrodes 371 in the power generation sub-layer 39. The first direction X is perpendicular to the second direction Y.

Specifically, as shown in FIG. 9, when the six power generation sub-layers 39 are arranged in two rows and three columns, the first sub-portion 51, the second sub-portion 53, and the third sub-portion 55 are arranged sequentially in the first direction X and are arranged at intervals by an "S"-shaped groove. The first sub-portion 51 is electrically connected to all positive electrodes 371 on the power generation sub-layer (a) 39, and the other first sub-portion 51 is electrically connected to all negative electrodes 373 on the power generation sub-layer (d) 39. Moreover, the two first sub-portions 51 are electrically connected to each other, and are configured to make the power generation sub-layer (a) 39 be connected to the power generation sub-layer (d) 39 in series. The second sub-portion 53 is electrically connected to all negative electrodes 373 on the power generation sub-layer (a) 39 and all positive electrodes 371 on the power generation sub-layer (b) 39, all negative electrodes 373 on the power generation sub-layer (b) 39 and all positive electrodes 371 on the power generation sub-layer (c) 39, all positive electrodes 371 on the power generation sub-layer (d) 39 and all negative electrodes 373 on the power generation sub-layer (e) 39, and all positive electrodes 371 on the power generation sub-layer (e) 39 and all negative electrodes 373 on the power generation sub-layer (f) 39. The second sub-section 53 is configured to make the power generation sub-layer (a) 39 be connected to the power generation sub-layer (b) 39 in series, make the power generation sub-layer (b) 39 be connected to the power generation sub-layer (c) 39 in series, make the power generation sub-layer (d) 39 be connected to the power generation sub-layer (e) 39 in series, and make the power generation sub-layer (e) 39 be connected to the power generation sub-layer (f) 39 in series. The third sub-portion 55 is electrically connected to all the negative electrodes 373 of the power generation sub-layer (c) 39, and the other third sub-portion 55 is electrically connected to all the positive electrodes 371 of the power generation sub-layer (f) 39. The first sub-portion 51, the second sub-portion 53, and the third sub-portion 55 make all the power generation sub-layers 39 be sequentially connected in series. Finally, the positive electrode 371 and the negative electrode 373 are drawn from the two third sub-portions 55, respectively, and are connected to an external circuit to form a loop. In this way, the electric energy of the power generation layer 30 flows to other devices through the current transmission layer 50.

Figure 11:
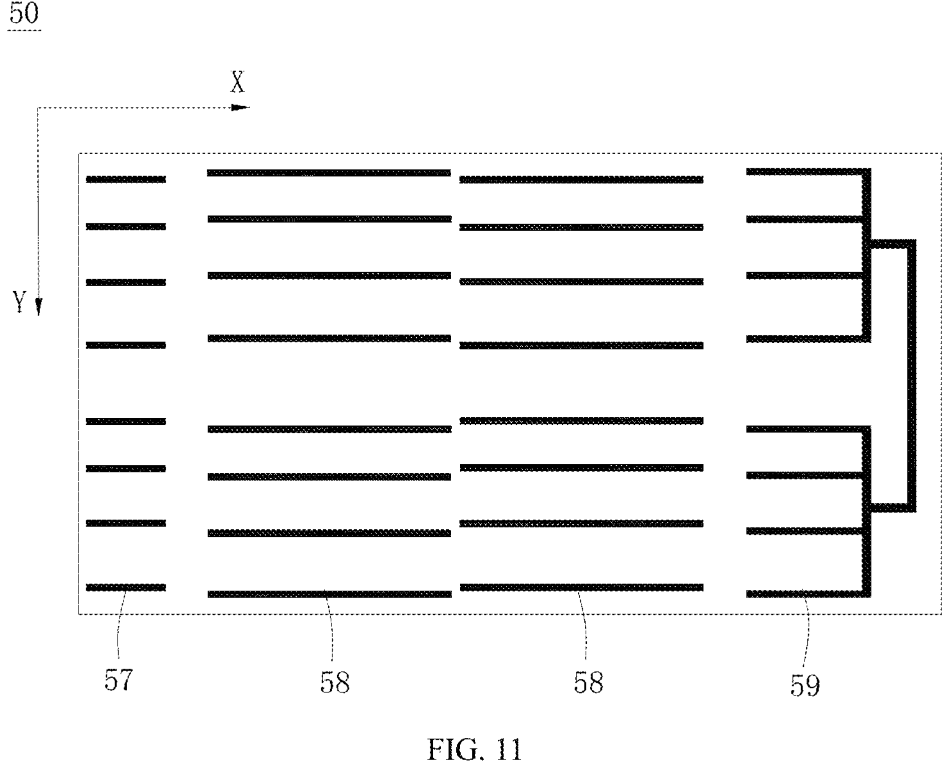
FIG. 11 is a schematic plan view showing a current transmission layer of a curved photovoltaic member according to another implementation of the present disclosure.

Referring to FIG. 2, FIG. 10, and FIG. 11, in other some implementations, the electrode layer 37 includes a plurality of positive electrodes 371 and a plurality of negative electrodes 373. Each of the plurality of positive electrodes 371 is in a linear shape. Each of the plurality of negative electrodes 373 is in a linear shape. The current transmission layer 50 is in a linear shape. The current transmission layer 50 is connected to the plurality of negative electrodes 373 and the plurality of positive electrodes 371 in series and/or in parallel. In the implementation, the linear current transmission layer 50 is connected to the plurality of positive electrodes 371 and the plurality of negative electrodes 373 of the electrode layer 37 in series.

Referring to FIG. 10, specifically, the power generation layer 30 includes a plurality of power generation sub-layers 39 arranged in an array. Each of the plurality of power generation sub-layers 39 includes a plurality of positive electrodes 371 arranged in a second direction Y of the current transmission layer 50 and a plurality of negative electrodes 373 arranged in the second direction Y of the current transmission layer 50. The positive electrodes 371 and the negative electrodes 373 are alternatively arranged with each other. A quantity of power generation sub-layers 39 may be two, three, four, six, or more. When there are three power generation sub-layers 39, the three power generation sub-layers 39 are sequentially connected to form the arrangement form of three rows and one column. When there are four power generation sub-layers 39, the four power generation sub-layers 39 may be sequentially connected in the arrangement form of four rows and one column or arranged in the arrangement form of two rows and two columns (in the "matts" shape). When there are six power generation sub-layers 39, the six power generation sub-layers 39 may be sequentially connected in the arrangement form of six rows and one column or arranged in the arrangement form of two rows and three columns. When there are six power generation sub-layers 39 in the present disclosure, the six power generation sub-layers 39 are arranged to form the arrangement form of two rows and three columns.

A quantity of positive electrodes 371 on each power generation sub-layer 39 may be two, three, four, or more, and a quantity of negative electrodes 373 on each power generation sub-layer 39 is the same as the quantity of positive electrodes 371. The quantity of positive electrodes 371 and the quantity of negative electrodes 373 in each power generation sub-layer 39 of the implementation is four. The four positive electrodes 371 are sequentially arranged at intervals in the second direction Y, and the four negative electrodes 373 are sequentially arranged at intervals in the second direction Y. Moreover, the arrangement form of staggering in rows is formed between the positive electrodes 371 and the negative electrodes 373.

Figure 12:
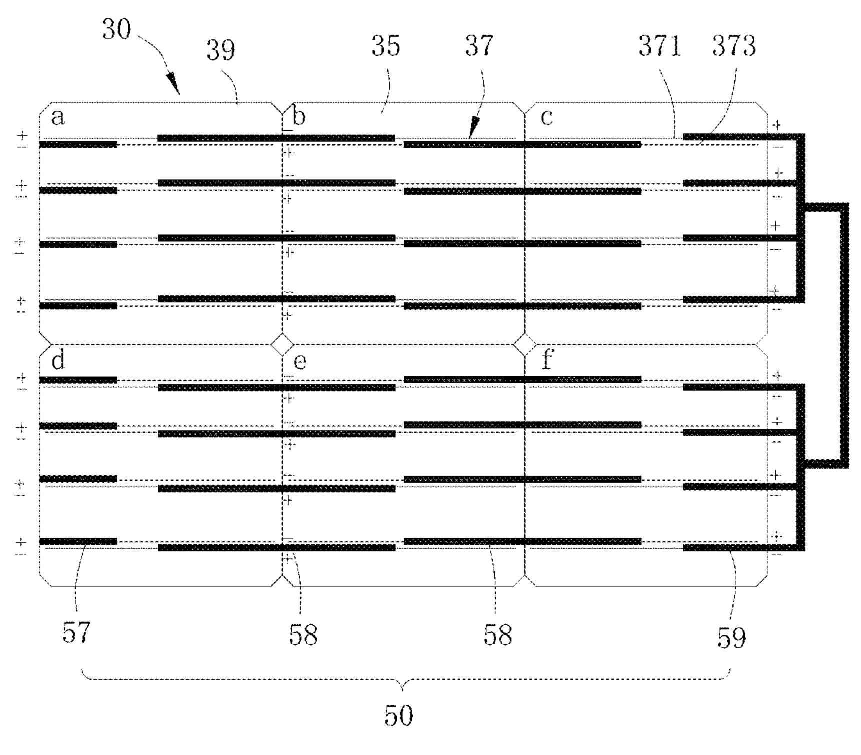
FIG. 12 is a schematic view of an engagement of the power generation layer shown in FIG. 10 and the current transmission layer shown in FIG. 11 according to the present disclosure.

Referring to FIG. 11 and FIG. 12, in a case where each of the positive electrode 371 and the negative electrode 373 is in a linear shape, the current transmission layer 50 is in a linear shape and includes a plurality of first conductive wires 57, a plurality of second conductive wires 58, and a plurality of third conductive wires 59. The plurality of first conductive wires 57, the plurality of second conductive wires 58, and the plurality of third conductive wires 59 are sequentially staggered from each other in the first direction X and arranged at intervals. The plurality of first conductive wires 27 are configured to electrically connect positive electrodes 371 or negative electrodes 373 in the power generation sub-layer 39. The plurality of second conductive wires 58 are configured to electrically connect positive electrodes 371 and negative electrodes 373 of two adjacent power generation sub-layers 39 of the plurality of power generation sub-layers 39 in the first direction X. The plurality of third conductive wires 59 are configured to electrically connect positive electrodes 371 or negative electrodes 373 in the power generation sub-layer 39 and electrically connect positive electrodes 371 and negative electrodes 373 adjacent to the positive electrodes 371 in the second direction Y.

As shown in FIG. 12, the second conductive wire 58 is electrically connected to all the positive electrodes 371 of the power generation sub-layer (a) 39 and all the negative electrodes 373 of the power generation sub-layer (b) 39, to all the positive electrodes 371 of the power generation sub-layer (b) 39 and all the negative electrodes 373 of the power generation sub-layer (c) 39, to all the negative electrodes 373 of the power generation sub-layer (d) 39 and all the positive electrodes 371 of the power generation sub-layer (e) 39, and to all the negative electrodes 373 of the power generation sub-layer (e) 39 and all the positive electrodes 371 of the power generation sub-layer (f) 39. The second conductive wire 58 is configured to make the power generation sub-layer (a) 39 be connected to the power generation sub-layer (b) 39 in series, make the power generation sub-layer (b) 39 be connected to the power generation sub-layer (c) 39 in series, make the power generation sub-layer (d) 39 be connected to the power generation sub-layer (e) 39 in series, and make the power generation sub-layer (e) 39 be connected to the power generation sub-layer (f) 39 in series. The third conductive wire 59 is electrically connected to all the positive electrodes 371 of the power generation sub-layer (c) 39 and all the negative electrodes 373 of the power generation sub-layer (f) 39, and is configured to make the power generation sub-layer (c) 39 be connected to the power generation sub-layer (f) 39 in series. The first conductive wire 57 is electrically connected to all the negative electrodes 373 of the power generation sub-layer (a) 39, and the other first conductive wire 57 is electrically connected to all the positive electrodes 371 of the power generation sub-layer (d) 39. The first conductive wire 57, the second conductive wire 58, and the third conductive wire 59 make all the power generation sub-layers 39 be sequentially connected in series. Finally, the positive electrode 371 and the negative electrode 373 are drawn from the two first conductive wires 57, respectively, and are connected to the external circuit to form the loop. In this way, the electric energy of the power generation layer 30 may flow to other devices through the current transmission layer 50.

Referring to FIG. 1, further, in some implementations, the curved photovoltaic member 100 further includes a first adhesive layer 20 and a second adhesive layer 60. The first adhesive layer 20 is configured to connect the front plate 10 and the power generation layer 30, and the second adhesive layer 60 is configured to connect the current transmission layer 50 and the back plate 70.

Specifically, the first adhesive layer 20 is configured to make the front plate 10 be tightly connected to the first side 31 of the power generation layer 30, and the second adhesive layer 60 is configured to make the current transmission layer 50 be tightly connected to the back plate 70. In this way, a connection between structures of the curved photovoltaic member 100 is tight. Preferably, the first adhesive layer 20 may be an optically transparent adhesive. In this way, in a process where the light passes through the front plate 10 and the first adhesive layer 20 to reach the power generation layer 30, an amount of loss of the light passing through the first adhesive layer 20 is small. For example, light transmittance of the first adhesive layer 20 may be greater than or equal to 70%. The light transmittance of the first adhesive layer 2030 may be 70%, 72.5%, 76.8%, 79.4%, 81%, 83.6%, 85.4%, 87.1%, 91.2%, 94.7%, 95.8%, 97.4%, 100%, or the like. The optically transparent adhesive includes, but is not limited to, ethylene vinyl acetate (EVA), poly olefin elastomer (POE), polyvinyl butyral (PVB), silica gel, and the like.

The second adhesive layer 60 may be light-transmittable, and the second adhesive layer 60 may also be lighttight. When the second adhesive layer 60 is light-transmittable, the second adhesive layer 60 may be the same optically transparent adhesive as the first adhesive layer 20. When the second adhesive layer 60 is lighttight, the second adhesive layer 60 may be a transparent cutoff adhesive film or a black adhesive film. The black adhesive film is hardly light-transmitting. The transparent cutoff adhesive film has light transmittance smaller than or equal to 30%.

Referring to FIG. 13, a photovoltaic building surface 1000 according to the implementations of the present disclosure includes the curved photovoltaic member 100 according to any one of the above implementations. Adjacent curved photovoltaic members 100 are connected to each other. When the product is required to be waterproof, compared with a planar photovoltaic member, an area required to be overlapped when the adjacent curved photovoltaic members 100 are overlapped with each other is small, a contact area between the curved photovoltaic members 100 and the light is large, and the photoelectric conversion efficiency is high.

In the curved photovoltaic member 100 according to the implementations of the present disclosure, the current transmission layer 50 is provided only at the second side 33 of the power generation layer 30, and the current transmission layer 50 is not provided at the first side 31 of the power generation layer 30. In this way, the contact area between the first side 31 of the power generation layer 30 and the light is larger, the light utilization rate of the power generation layer 30 is higher, and the power generation efficiency of the curved photovoltaic member 100 is higher. Moreover, since the current transmission layer 50 is only provided at the second side 33 of the power generation layer 30, the power generation layer 30 may be entirely bent with a large curvature, and the curved photovoltaic member 100 has a large bending curvature. Compared with the current curved photovoltaic member, the curved photovoltaic member 100 according to the implementations of the present disclosure has a large curve curvature and provides a better fit with the building.

The technical features of the above embodiments can be combined arbitrarily. In order to make the description simple, not every possible combination of the technical features in the above embodiments are described. However, as long as there is no conflict between the combinations of the technical features, any combination of the technical features should be considered as falling in the scope of this specification. Meanwhile, other implementations can be derived from the above-described embodiments, so that structural and logical substitutions and changes can be made without departing from the scope of the present disclosure.

The above embodiments illustrate merely some implementations of the present disclosure Although description of the above embodiments is specific and detailed, the description should not be construed as limitations on the scope of the present disclosure. It should be pointed out that, various modifications and improvements can be made by those skilled in the art without departing from the concept of the embodiments of the present disclosure, and shall fall within the protection scope of the embodiments of the present disclosure as defined by the claims as attached.

What is claimed is:

1. A curved photovoltaic member, comprising:

a power generation layer comprising a first side and a second side opposite to the first side;

a current transmission layer located at the second side of the power generation layer and electrically connected to the power generation layer;

a front plate located at the first side of the power generation layer, the front plate being a rigid light-transmitting plate in a shape with a curved surface; and a back plate located at a side of the current transmission layer away from the power generation layer, wherein the front plate, the power generation layer, the current transmission layer, and the back plate are sequentially laminated, wherein the power generation layer comprises a photoelectric conversion layer and an electrode layer disposed at a side of the photoelectric conversion layer away from the front plate, the photoelectric conversion layer being configured to convert light energy into electric energy, and the electrode layer being electrically connected to the current transmission layer, wherein the back plate is a planar flexible film that is configured to bend into a shape with the same curved surface as the front plate, wherein the power generation layer is a planar silicon-based structure, wherein a longitudinal projection of the curved surface is a curve constituted by a plurality of curve segments connected in sequence, and wherein each of the plurality of curve segments has a bending radius ranging from 25 mm to 200 mm.

2. The curved photovoltaic member according to claim 1, wherein the current transmission layer is a metal conductive structure, wherein each of the power generation layer and the metal conductive structure is configured to bend into a shape with the same curved surface as the front plate.

3. The curved photovoltaic member according to claim 1, wherein:

two adjacent curve segments of the plurality of curve segments have opposite bending directions, and the plurality of curve segments has a same bending radius.

4. The curved photovoltaic member according to claim 1, wherein the electrode layer comprises a plurality of positive electrodes and a plurality of negative electrodes, each of the plurality of positive electrodes being in a dot shape, each of the plurality of negative electrodes being in a dot shape, the current transmission layer being in a sheet-like shape, the plurality of negative electrodes and the plurality of positive electrodes being connected in series and/or in parallel through the current transmission layer.

5. The curved photovoltaic member of claim 4, wherein:

the power generation layer comprises a plurality of power generation sub-layers arranged in an array, each of the plurality of power generation sub-layers comprising a plurality of positive electrodes arranged in an array and a plurality of negative electrodes arranged in an array, the array of the plurality of positive electrodes being staggered with the array of the plurality of negative electrodes in rows; and the current transmission layer comprises a first sub-portion, a second sub-portion, and a third sub-portion that are sequentially staggered from each other in a first direction and arranged at intervals, wherein:

the first sub-portion is configured to electrically connect positive electrodes or negative electrodes in the power generation sub-layer and configured to electrically connect positive electrodes and negative electrodes of two adjacent power generation sub-layers of the plurality of power generation sub-layers in a second direction;

the second sub-portion is configured to electrically connect positive electrodes and negative electrodes of two adjacent power generation sub-layers of the plurality of power generation sub-layers in the first direction;

the third sub-portion is configured to electrically connect negative electrodes or positive electrodes in the power generation sub-layer, wherein the first direction being perpendicular to the second direction.

6. The curved photovoltaic member according to claim 1, wherein the electrode layer comprises a plurality of positive electrodes and a plurality of negative electrodes, each of the plurality of positive electrodes being in a linear shape, each of the plurality of negative electrodes being in a linear shape, the current transmission layer being in a linear shape, and the plurality of negative electrodes and the plurality of positive electrodes being connected in series and/or in parallel through the current transmission layer.

7. The curved photovoltaic member according to claim 6, wherein:

the power generation layer comprises a plurality of power generation sub-layers arranged in an array, each of the plurality of power generation sub-layers comprising a plurality of positive electrodes arranged in a second direction and a plurality of negative electrodes arranged in a second direction, the plurality of positive electrodes and the plurality of negative electrodes being alternatively arranged; and the current transmission layer comprises a plurality of first conductive wires, a plurality of second conductive wires, and a plurality of third conductive wires that are arranged sequentially at intervals in a first direction, wherein:

the plurality of first conductive wires being configured to electrically connect positive electrodes or negative electrodes in the power generation sub-layer;

the plurality of second conductive wires being configured to electrically connect positive electrodes and negative electrodes of two adjacent power generation sub-layers of the plurality of power generation sub-layers in the first direction; and the plurality of third conductive wires being configured to electrically connect positive electrodes or negative electrodes in the power generation sub-layer and configured to electrically connect positive electrodes and negative electrodes of two adjacent power generation sub-layers of the plurality of power generation sub-layers in a second direction of the current transmission layer, wherein the first direction being perpendicular to the second direction.

8. The curved photovoltaic member according to claim 1, further comprising a first adhesive layer and a second adhesive layer, the first adhesive layer being configured to connect the front plate and the power generation layer, and the second adhesive layer being configured to connect the current transmission layer and the back plate.

9. A photovoltaic building surface, comprising a plurality of curved photovoltaic members, adjacent curved photovoltaic members being connected to each other, each of the plurality of curved photovoltaic members comprising:

a power generation layer comprising a first side and a second side opposite to the first side;

a current transmission layer located at the second side of the power generation layer and electrically connected to the power generation layer;

a front plate located at the first side of the power generation layer, the front plate being a rigid light-transmitting plate in a shape with a curved surface; and a back plate located at a side of the current transmission layer away from the power generation layer, wherein the front plate, the power generation layer, the current transmission layer, and the back plate are sequentially laminated, wherein the power generation layer comprises a photoelectric conversion layer and an electrode layer disposed at a side of the photoelectric conversion layer away from the front plate, the photoelectric conversion layer being configured to convert light energy into electric energy, and the electrode layer being electrically connected to the current transmission layer, wherein the back plate is a planar flexible film that is configured to bend into a shape with the same curved surface as the front plate, wherein the power generation layer is a planar silicon-based structure, wherein a longitudinal projection of the curved surface is a curve constituted by a plurality of curve segments connected in sequence, and wherein each of the plurality of curve segments has a bending radius ranging from 25 mm to 200 mm.

10. The photovoltaic building surface according to claim 9, wherein:

the current transmission layer is a metal conductive structure, wherein each of the power generation layer and the metal conductive structure is configured to bend into a shape with the same curved surface as the front plate.

11. The photovoltaic building surface according to claim 9, wherein:

two adjacent curve segments of the plurality of curve segments have opposite bending directions, and the plurality of curve segments has a same bending radius.

12. The photovoltaic building surface according to claim 9, wherein the electrode layer comprises a plurality of positive electrodes and a plurality of negative electrodes, each of the plurality of positive electrodes being in a dot shape, each of the plurality of negative electrodes being in a dot shape, the current transmission layer being in a sheet-like shape, the plurality of negative electrodes and the plurality of positive electrodes being connected in series and/or in parallel through the current transmission layer.

13. The photovoltaic building surface of claim 12, wherein:

the power generation layer comprises a plurality of power generation sub-layers arranged in an array, each of the plurality of power generation sub-layers comprising a plurality of positive electrodes arranged in an array and a plurality of negative electrodes arranged in an array, the array of the plurality of positive electrodes being staggered with the array of the plurality of negative electrodes in rows; and the current transmission layer comprises a first sub-portion, a second sub-portion, and a third sub-portion that are sequentially staggered from each other in a first direction and arranged at intervals, wherein:

the first sub-portion is configured to electrically connect positive electrodes or negative electrodes in the power generation sub-layer and configured to electrically connect positive electrodes and negative electrodes of two adjacent power generation sub-layers of the plurality of power generation sub-layers in a second direction;

the second sub-portion is configured to electrically connect positive electrodes and negative electrodes of two adjacent power generation sub-layers of the plurality of power generation sub-layers in the first direction;

the third sub-portion is configured to electrically connect negative electrodes or positive electrodes in the power generation sub-layer, wherein the first direction being perpendicular to the second direction.

14. The photovoltaic building surface according to claim 9, wherein the electrode layer comprises a plurality of positive electrodes and a plurality of negative electrodes, each of the plurality of positive electrodes being in a linear shape, each of the plurality of negative electrodes being in a linear shape, the current transmission layer being in a linear shape, and the plurality of negative electrodes and the plurality of positive electrodes being connected in series and/or in parallel through the current transmission layer.

* * * * *